(12) United States Patent
Sumihiro

(10) Patent No.: US 11,249,279 B2
(45) Date of Patent: Feb. 15, 2022

(54) IMAGING APPARATUS AND CONTROL METHOD OF IMAGING APPARATUS

(71) Applicant: Sony Group Corporation, Tokyo (JP)

(72) Inventor: Hiroshi Sumihiro, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 0 days.

(21) Appl. No.: 16/063,866

(22) PCT Filed: Nov. 9, 2016

(86) PCT No.: PCT/JP2016/083160
§ 371 (c)(1),
(2) Date: Jun. 19, 2018

(87) PCT Pub. No.: WO2017/138200
PCT Pub. Date: Aug. 17, 2017

(65) Prior Publication Data
US 2018/0364451 A1    Dec. 20, 2018

(30) Foreign Application Priority Data

Feb. 10, 2016 (JP) .............................. JP2016-023373

(51) Int. Cl.
*G02B 7/09*    (2021.01)
*G03B 13/36*    (2021.01)
(Continued)

(52) U.S. Cl.
CPC ................. *G02B 7/36* (2013.01); *G02B 7/09* (2013.01); *H04N 5/232* (2013.01);
(Continued)

(58) Field of Classification Search
CPC . G02B 7/36; G02B 7/09; H04N 5/378; H04N 5/3575; H04N 5/3532; H04N 5/232;
(Continued)

(56) References Cited

U.S. PATENT DOCUMENTS

| 2006/0033831 A1* | 2/2006 | Ejima ................ H04N 5/23296 348/333.01 |
| 2006/0198624 A1* | 9/2006 | Ono ........................ G02B 7/28 396/133 |

(Continued)

FOREIGN PATENT DOCUMENTS

| JP | 2012-004818 A | 1/2012 |
| JP | 2013-080248 A | 5/2013 |

(Continued)

*Primary Examiner* — Abdelaaziz Tissire
(74) *Attorney, Agent, or Firm* — Michael Best & Friedrich LLP

(57) ABSTRACT

An imaging apparatus includes: a focus lens driving section; an imaging section; and a focus detecting section. The focus lens driving section moves a position of a focus lens from one of an image side and an object side to the other over a predetermined driving period. The imaging section generates image data by starting exposure for a plurality of lines simultaneously and then by ending the exposure for the plurality of lines simultaneously within the predetermined driving period. The focus detecting section detects an in-focus position of the focus lens on a basis of contrast of the image data.

18 Claims, 17 Drawing Sheets

(51) Int. Cl.
- *H04N 5/232* (2006.01)
- *G02B 7/36* (2021.01)
- *H04N 5/235* (2006.01)
- *H04N 5/357* (2011.01)
- *H04N 5/353* (2011.01)
- *H04N 5/378* (2011.01)
- *H01L 27/146* (2006.01)

(52) U.S. Cl.
CPC ..... *H04N 5/2353* (2013.01); *H04N 5/232123* (2018.08); *H04N 5/3532* (2013.01); *H04N 5/3575* (2013.01); *H04N 5/378* (2013.01); *G03B 13/36* (2013.01); *H01L 27/14634* (2013.01); *H01L 27/14645* (2013.01)

(58) Field of Classification Search
CPC ............ H04N 5/232123; H04N 5/2353; H01L 27/14634; H01L 27/14645; G03B 13/36
See application file for complete search history.

(56) References Cited

U.S. PATENT DOCUMENTS

| | | | | |
|---|---|---|---|---|
| 2007/0223887 A1* | 9/2007 | Kanamori | ............... | H04N 5/232 386/232 |
| 2008/0002038 A1* | 1/2008 | Suwa | ................... | H04N 5/2352 348/229.1 |
| 2008/0292298 A1* | 11/2008 | Hirai | ..................... | G02B 7/38 396/121 |
| 2009/0009651 A1* | 1/2009 | Takayanagi | ........ | H04N 5/23212 348/345 |
| 2009/0294813 A1* | 12/2009 | Gambino | .......... | H01L 27/14632 257/292 |
| 2010/0033591 A1* | 2/2010 | Kawaguchi | ............ | H04N 5/343 348/222.1 |
| 2012/0194696 A1* | 8/2012 | Ohshitanai | ........ | H01L 27/14625 348/222.1 |
| 2013/0033638 A1* | 2/2013 | Hamada | ............. | H04N 5/23293 348/345 |
| 2013/0201364 A1* | 8/2013 | Shimizu | ............... | H04N 5/2353 348/229.1 |
| 2013/0221470 A1* | 8/2013 | Kinsman | ........... | H01L 27/14618 257/434 |
| 2013/0308036 A1* | 11/2013 | Peng | .................. | H04N 5/23212 348/345 |
| 2013/0314573 A1* | 11/2013 | Tsukimura | ............. | H04N 5/335 348/302 |
| 2014/0184866 A1* | 7/2014 | Ogushi | ............. | H04N 5/23212 348/308 |
| 2014/0192216 A1* | 7/2014 | Matsumoto | ........ | H04N 5/23212 348/222.1 |
| 2014/0285705 A1* | 9/2014 | Uchida | ............. | H04N 5/23212 348/345 |
| 2014/0307054 A1* | 10/2014 | Chang | ................ | H04N 5/23212 348/47 |
| 2015/0163395 A1* | 6/2015 | Konishi | ............... | H04N 5/2353 348/230.1 |
| 2015/0163440 A1* | 6/2015 | Furumochi | ............ | H04N 9/735 348/223.1 |
| 2017/0104918 A1* | 4/2017 | Iwane | .................... | G03B 19/12 |

FOREIGN PATENT DOCUMENTS

| | | |
|---|---|---|
| JP | 2013-130643 A | 7/2013 |
| JP | 2015-118338 A | 6/2015 |
| JP | 2015-177429 A | 10/2015 |

\* cited by examiner

FIG. 11
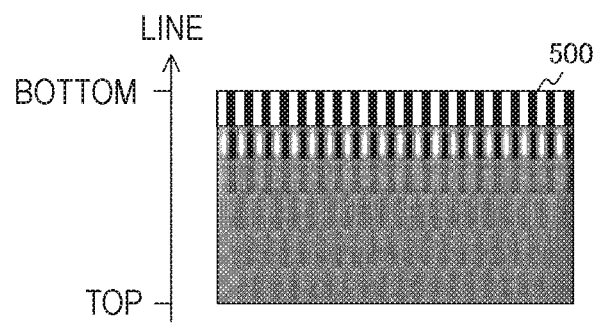
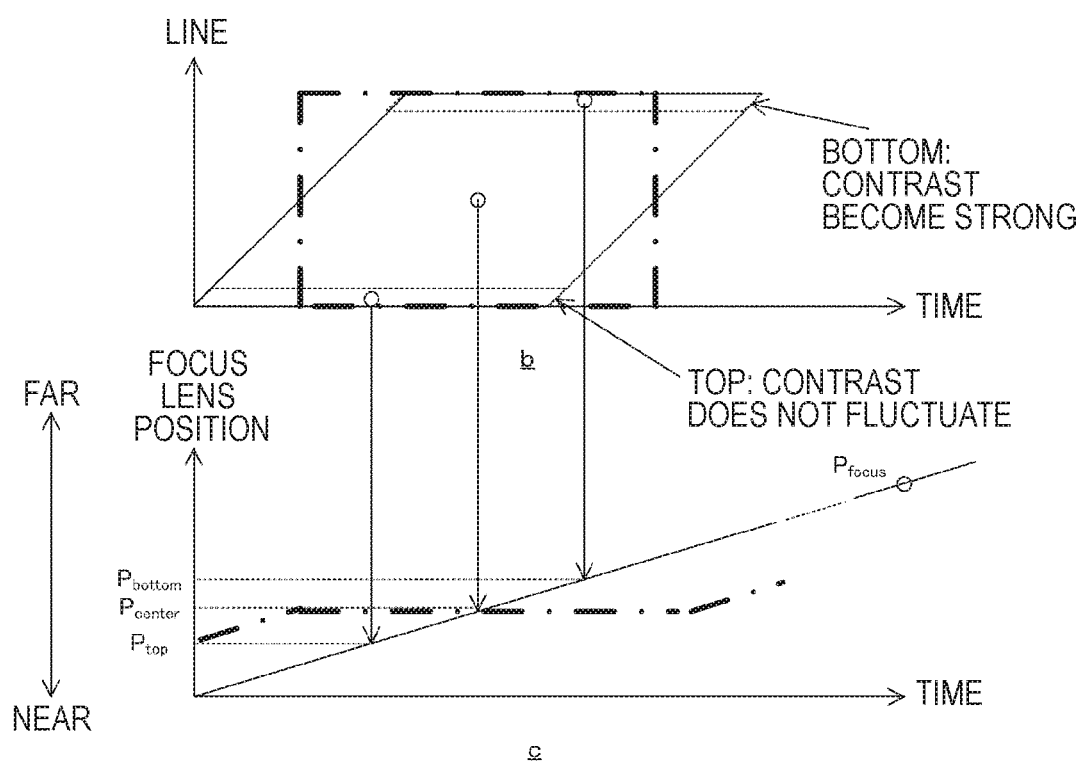

IMAGING APPARATUS AND CONTROL METHOD OF IMAGING APPARATUS

TECHNICAL FIELD

The present technology is related to an imaging apparatus and a control method of an imaging apparatus. For more details, it is related an imaging apparatus that detects a focus on the basis of contrast, and a control method of an imaging apparatus.

BACKGROUND ART

Hitherto, the contrast AF (Auto Focus) system that detects a focus on the basis of contrast has been widely used in imaging apparatuses and so on. This contrast AF system is classified into a method that drives a focus lens also during imaging and a method that drives a focus lens only when not imaging. In the case of performing the detection of a focus at high speed, the former method is used. For example, an imaging apparatus has been proposed that images an image with the rolling shutter system while driving a focus lens and detects an in-focus position of the focus lens on the basis of the contrast evaluation value of the image (for example, refer to Patent Literature 1). Here, the rolling shutter system is a system in which the starting of exposure and the ending of exposure are performed for each of lines within an image sequentially at a different timing. On the contrary, a system in which the starting of exposure and the ending of exposure are performed simultaneously for all the lines, is called the global shutter system.

CITATION LIST

Patent Literature

Patent Literature 1: JP 2013-80248A

DISCLOSURE OF INVENTION

Technical Problem

In the above-mentioned imaging apparatus, during the driving of a focus lens, imaging is performed with the rolling shutter system in which an exposure timing for each line is different. Accordingly, the position of the focus lens at the time of exposure becomes different for each line. For example, in the case of moving a focus lens from "Near" to "Far", relative to the position $P_{top}$ of the focus lens at a top line $L_{top}$ for which the exposure timing is the earliest, the position $P_{bottom}$ at a bottom line $L_{bottom}$ for which the exposure timing is the lattermost, becomes the "Far" side. In the case where the position $P_{bottom}$ is closer to an in-focus position than the position $P_{top}$, the contrast of the bottom line $L_{bottom}$ becomes comparatively strong, and the contrast of the top line $L_{top}$ becomes comparatively weak. Here, in the case of imaging a photographic subject in which the contrast becomes stronger as closer to the bottom line, the contrast of the whole AF area becomes stronger than the actual value, which causes an error in the contrast evaluation value. As a result, focus detection accuracy lowers.

In the case of a constitution where a driver stops a focus lens during exposure, the position of the focus lens for each line becomes the same, whereby the focus detection accuracy can be improved. However, in such a constitution, a detection speed of a focus lowers. Thus, in the above-mentioned imaging apparatus, there is a problem that it is difficult to detect a focus with high accuracy and at high speed.

The present technology has been created in view of such a situation, and an object is to detect a focus with high accuracy and at high speed in the contrast AF system.

Solution to Problem

The present technology has been made to solve the above problem. A first aspect of the present technology is an imaging apparatus and a control method thereof. The imaging apparatus includes: a focus lens driving section that moves a position of a focus lens from one of an image side and an object side to the other over a predetermined driving period; an imaging section that generates image data by starting exposure for a plurality of lines simultaneously and then by ending the exposure for the plurality of lines simultaneously within the predetermined driving period; and a focus detecting section that detects an in-focus position of the focus lens on a basis of contrast of the image data. This brings an action that exposure for a plurality of lines is started and ended simultaneously within a driving period of a focus lens.

In addition, according to the first aspect, the plurality of lines may include a plurality of pixel blocks arranged in a predetermined direction, and each of the plurality of pixel blocks may include a floating diffusion layer, a plurality of photoelectric conversion sections, and a plurality of transfer transistors that transfers respective electric charges generated by the plurality of photoelectric conversion sections, to the floating diffusion layer. This brings an action that image data is imaged by a plurality of pixels that share a floating diffusion layer.

In addition, according to the first aspect, the plurality of transfer transistors may transfer the electric charges to the floating diffusion layer simultaneously at a starting time point and at an ending time point of a predetermined exposure period within the driving period. This brings an action that exposure for all the lines is started and ended simultaneously.

In addition, according to the first aspect, some transistors among the plurality of transfer transistors may transfer the electric charges to the floating diffusion layer simultaneously at a starting time point and at an ending time point of a predetermined exposure period within the driving period. This brings an action that exposure for some of the lines is started and ended simultaneously.

In addition, according to the first aspect, the focus lens driving section may move the focus lens to the in-focus position. In addition, when the focus lens has moved to the in-focus position, the imaging section may image high resolution image data with resolution higher than the image data, by starting exposure for lines more than the plurality of lines sequentially and then by ending exposure for the plurality of lines sequentially. This brings an action that after a focus lens has been moved to an in-focus position, image data with high resolution is imaged.

In addition, according to the first aspect, each of the plurality of lines may include a plurality of pixels arranged in a predetermined direction. In addition, each of the plurality of pixels may include a floating diffusion layer, a photoelectric conversion section, and a transfer transistor that transfers an electric charge generated by the photoelectric conversion section to the floating diffusion layer. This brings an action that image data is imaged by pixels in which a floating diffusion layer is disposed for each pixel.

In addition, according to the first aspect, the imaging apparatus may further include: a depth map creating section that creates a depth map from the in-focus position; and a latter-stage processing section that executes predetermined image processing for new image data different from the image data on a basis of the depth map. The focus lens driving section may move the focus lens to the in-focus position. When the focus lens has moved to the in-focus position, the imaging section may image the new image data. This brings an action that on the basis of a depth map, predetermined image processing is executed for image data imaged after a focus lens has been moved to the above-mentioned in-focus position.

In addition, according to the first aspect, the imaging section may include a pixel array section in which a plurality of lines is arranged, a driver that causes an image signal to be generated by starting exposure for the plurality of lines simultaneously and then by ending exposure for the plurality of lines simultaneously within the predetermined driving period, and a signal processing section that generates the image data by performing predetermined signal processing for the image signal. This brings an action that predetermined image processing is executed for image signals.

In addition, according to the first aspect, the signal processing may include correlated double sampling processing. This brings an action that image data having been subjected correlated double sampling processing is imaged.

In addition, according to the first aspect, the pixel array section may be disposed in a predetermined chip among a plurality of stacked chips, and the signal processing section may be disposed in a chip different from the predetermined chip among the plurality of chips. This brings an action that image data is imaged by a pixel array section and a signal processing section that are dispersed in a plurality of stacked chips.

In addition, according to the first aspect, the imaging section may include a complementary metal oxide semiconductor (CMOS) image sensor. This brings an action that image data is imaged by a CMOS image sensor.

In addition, a second aspect of the present technology is an imaging apparatus including: an imaging section that performs processing that generates image data by starting exposure for a plurality of lines simultaneously and then by ending the exposure for the plurality of lines simultaneously, and processing that generates high resolution image data with resolution higher than the image data by starting exposure for a plurality of lines sequentially and then by ending the exposure for the plurality of lines sequentially; and an image processing section that performs processing that detects an in-focus position of the focus lens on a basis of contrast of the image data, and predetermined image processing for the high resolution image data. This brings an action that an in-focus position is detected on the basis of the contrast of image data, and predetermined image processing is executed for image data with high resolution.

Advantageous Effects of Invention

According to the present technology, it is possible to attain an excellent effect that a focus can be detected with high accuracy and at high speed in the contrast AF system. Note that effects described herein are not necessarily limitative, and any effect that is desired to be described in the present disclosure may be admitted.

BRIEF DESCRIPTION OF DRAWINGS

FIG. 11 is a diagram for describing the AF accuracy in a comparative example.

MODE(S) FOR CARRYING OUT THE INVENTION

Hereinafter, a mode for executing the present technology (hereafter, referred to as an embodiment) will be described. The description is given in the following order.

1. First embodiment (example of detecting contrast of image imaged with global shutter system)

2. Second embodiment (example of detecting contrast of image imaged with global shutter system and imaging with rolling shutter system)

3. Third embodiment (example of detecting contrast of image imaged with global shutter system and creating depth map)

1. First Embodiment

[Constitution Example of Imaging Apparatus]

Figure 1:
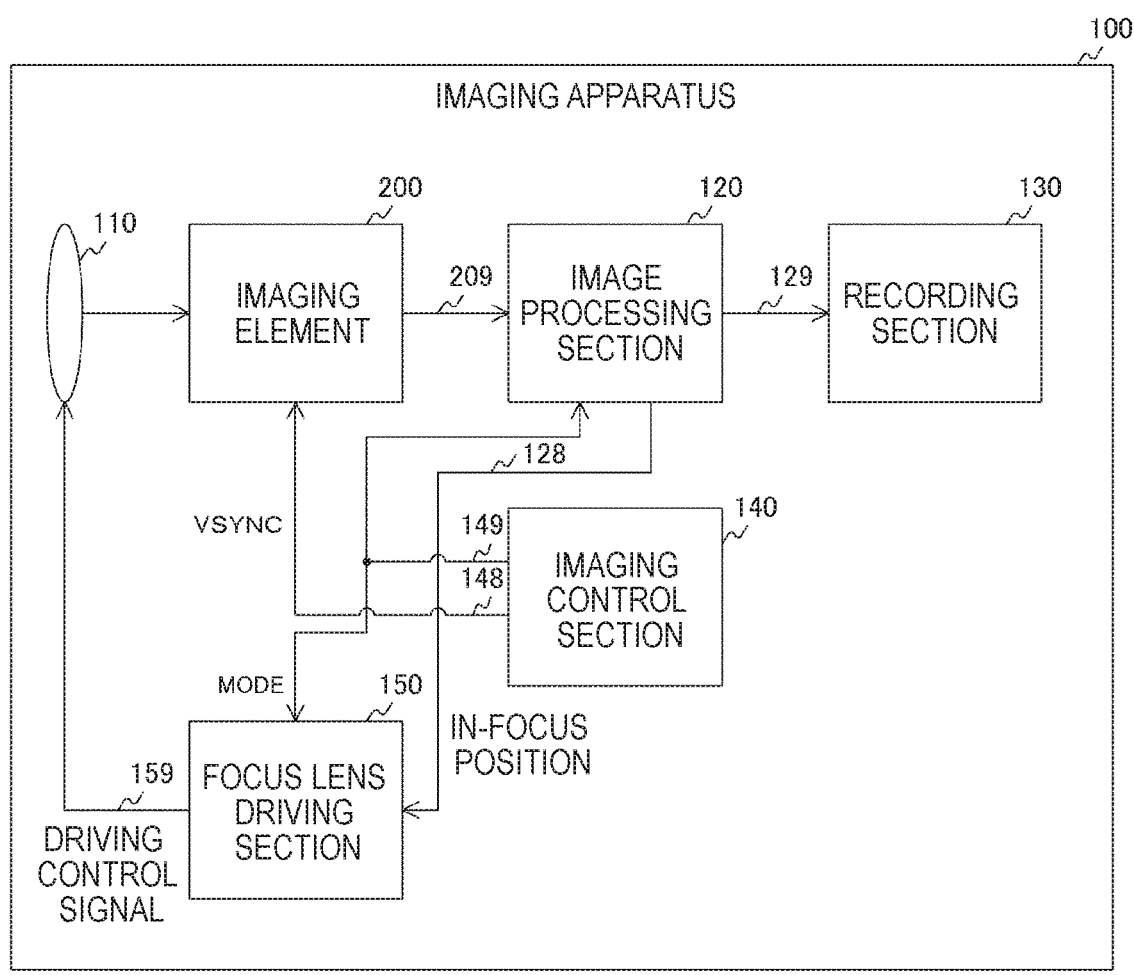
FIG. 1 is a block diagram showing one constitution example of an imaging apparatus in the first embodiment of the present technology.

FIG. 1 is a block diagram showing one constitution example of an imaging apparatus 100 in the first embodiment in an embodiment. As this imaging apparatus 100, a digital still camera, a video camera, a smart phone, etc. are supposed. The imaging apparatus 100 includes an imaging lens 110, an imaging element 200, an image processing section 120, a recording section 130, an imaging control section 140, and a focus lens driving section 150.

The imaging lens 110 collects light from a photographic subject and leads to the imaging element 200. This imaging lens includes a plurality of lenses including a focus lens.

The imaging element 200 generates image data in synchronization with vertical synchronization signals VSYNC from the imaging control section 140. As this imaging element 200, for example, a CMOS (Complementary Metal Oxide Semiconductor Image) image sensor is used. The imaging element 200 supplies the generated image data to the image processing section 120 through a signal line 209.

It should be noted that a portion including the imaging lens 110 and the imaging element 200 is one example of an imaging section described in claims.

The image processing section 120 performs various kinds of image processing for image data in accordance with the control of the imaging control section 140. Into this image processing section 120, a mode signal MODE generated by the imaging control section 140 is input. This mode signal MODE is a signal that indicates whether the imaging apparatus 100 is in a sensing mode or a viewing mode. Among these modes, the sensing mode is a mode that detects an in-focus position of a focus lens by the contrast AF system. On the other hand, the viewing mode is a mode that images image data in a state where the focus lens has moved to the in-focus position.

In the sensing mode, the image processing section 120 detects the in-focus position of the focus lens on the basis of the contrast of image data. Then, the image processing section 120 supplies the in-focus position to the focus lens driving section 150 through a signal line 128.

On the other hand, in the viewing mode, the image processing section 120 performs various kinds of image processing, such as demosaic processing and white balance processing, for image data. Then, the image processing section 120 supplies the image data after the processing to the recording section 130 through a signal line 129. The recording section 130 records image data.

The imaging control section 140 controls the whole imaging apparatus 100. This imaging control section 140 generates the mode signal MODE and the vertical synchronization signal VSYNC in accordance with an operation by a user and the like. For example, in the case where an operation to depress a shutter button halfway has been performed, the imaging control section 140 sets a sensing mode to the mode signal MODE. Moreover, in the case where an operation to fully depress the shutter button has been performed, the imaging control section 140 sets a viewing mode to the mode signal MODE. Moreover, when the start of imaging is instructed by an operation for a button etc., the imaging control section 140 generates a periodic signal of a predetermined frequency as the vertical synchronization signal VSYNC. Successively, the imaging control section 140 supplies the vertical synchronization signal VSYNC to the imaging element 200 through a signal line 148, and, supplies the mode signal MODE to the image processing section 120 and the focus lens driving section 150 through a signal line 149. The vertical synchronization signal VSYNC is continuously supplied until the ending of the imaging is instructed. In this connection, in addition to the vertical synchronization signal VSYNC, the imaging control section 140 may supply a signal for controlling an exposure time, etc. to the imaging element 200 further.

The focus lens driving section 150 drives the focus lens. In the case where the sensing mode has been set, this focus lens driving section 150 moves the position of a focus lens continuously at a fixed speed from one of an image side ("Near") and an object side ("Far") to the other over a predetermined driving period. Within this driving period of the focus lens, a plurality of image data is imaged by the imaging element 200. During these periods of the imaging, the focus lens is continuously driven without being stopped. Then, in the case where an in-focus position is detected, the focus lens driving section 150 moves the focus lens to the in-focus position. Moreover, in the viewing mode, the focus lens driving section 150 fixes the focus lens at the in-focus position.

In this connection, the imaging lens 110, the imaging element 200, the image processing section 120, the recording section 130, the imaging control section 140, and the focus lens driving section 150 are disposed in the same apparatus. However, these components are disposed separately in a plurality of apparatuses. For example, the imaging lens 110 and the imaging element 200 may be disposed in a camera module attached to an information processing apparatus, and the remainder may be disposed in the information processing apparatus.

[Constitution Example of Image Processing Section]

Figure 2:
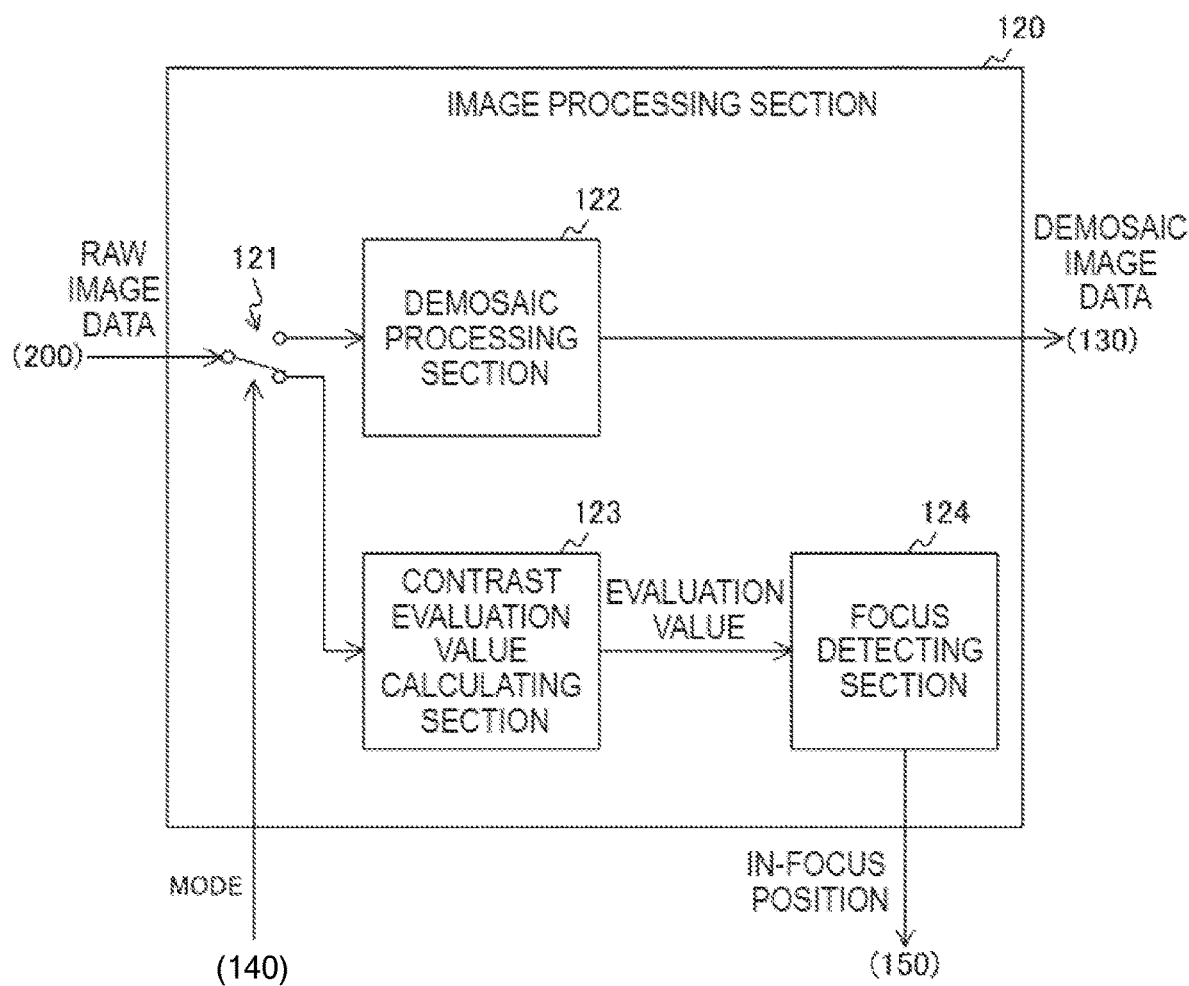
FIG. 2 is a block diagram showing one constitution example of an image processing section in the first embodiment of the present technology.

FIG. 2 is a block diagram showing one constitution example of the image processing section 120 in the first embodiment. This image processing section 120 includes a switching section 121, a demosaic processing section 122, a contrast evaluation value calculating section 123, and a focus detecting section 124.

The switching section 121 switches over the output destinations of image data in accordance with the mode signal MODE. To this switching section 121, the image data from the imaging element 200 is input as RAW image data. In the case where the sensing mode is set up, the switching section 121 supplies the RAW image data to the contrast evaluation value calculating section 123. On the other hand, in the case where the viewing mode is set up, the switching section 121 supplies the RAW image data to the demosaic processing section 122.

The demosaic processing section 122 performs demosaic processing that interpolates insufficient color information from pixels surrounding each pixel for the RAW image data. This demosaic processing section 122 supplied the image data after the demosaic processing as demosaic image data to the recording section 130.

In this connection, in the viewing mode, although the image processing section 120 performs the demosaic processing, it may perform further other image processing, such as white balance processing, YC conversion processing, and image synthesis processing. Moreover, the image processing section 120 may output the image data having been subjected to the white balance processing and the like without performing the demosaic processing.

The contrast evaluation value calculating section 123 calculates, for each time when RAW image data is input, a value indicating the degree of the intensity of contrast within an AF area in the RAW image data as a contrast evaluation value. Here, the AF area is an area for calculating a contrast evaluation value, and, some or all in image data is set as the AF area beforehand. The contrast evaluation value calculating section 123 extracts a high frequency component by using a high pass filter etc. that passes a high frequency component exceeding a predetermined cutoff frequency, and, calculates the value of the component as a contrast evaluation value. Then, the contrast evaluation value calculating section 123 supplies the calculated contrast evaluation value to the focus detecting section 124.

The focus detecting section 124 detects the position of the focus lens becoming in-focus as a focal position on the basis of the contrast evaluation value. For each of the RAW image data imaged during the driving of the focus lens, the focus detecting section 124 holds the position of the focus lens at the time of the imaging and the contrast evaluation value.

Here, since the focus lens is continuously driven also in the exposure period of the imaging element 200, a representative position representing the positions of the focus lens at respective time points within the exposure period is held for each of the RAW image data. For example, in the case where the focus lens is driven at a fixed speed, a lens position at the time point of the midpoint of the exposure period is used as a representative position.

From a plurality of contrast evaluation values and lens positions corresponding to the respective contrast evaluation values, the focus detecting section 124 detects a position of the focus lens at which the contrast becomes the strongest, as an in-focus position. The focus detecting section 124 supplies the detected in-focus position to the focus lens driving section 150.

[Constitution Example of Imaging Element]

Figure 3:
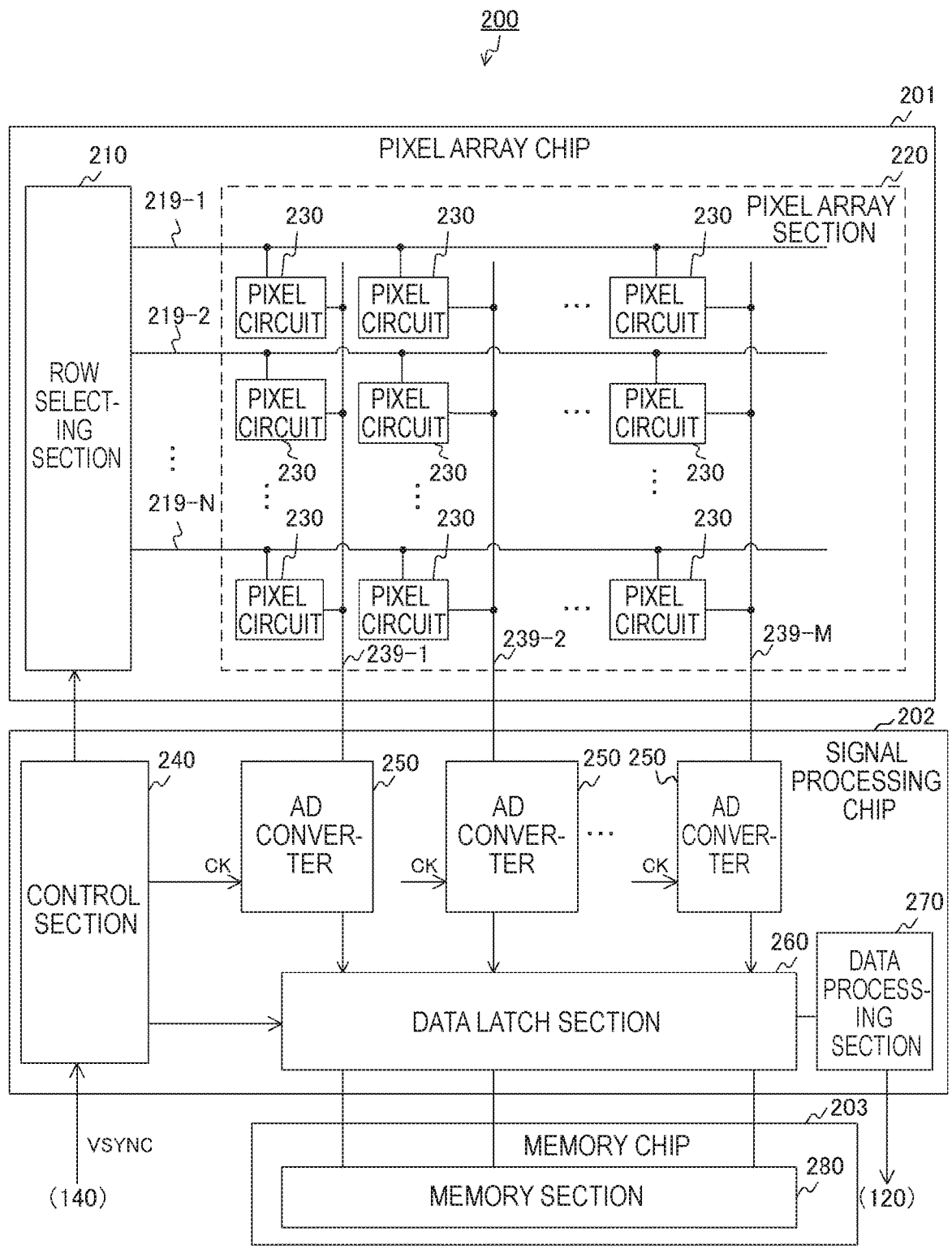
FIG. 3 is a block diagram showing one constitution example of an imaging element in the first embodiment of the present technology.

FIG. 3 is a block diagram showing one constitution example of the imaging element 200 in the first embodiment. This imaging element 200 includes a plurality of stacked chips. These chips include, for example, three layers of a pixel array chip 201, a signal processing chip 202, and a memory chip 203.

In the pixel array chips 201, a row selecting section 210 and a pixel array section 220 are disposed, and, in the pixel array section 220, a plurality of pixel circuits 230 is arranged in a two-dimensional lattice form. A set of pixel circuits 230 arranged in a predetermined direction is hereinafter referred to as a "row" or "line", and a set of pixel circuits 230 arranged in a direction perpendicular to the direction is hereinafter referred to as a "column". For example, N (N is an integer) rows and M (M is an integer) columns are disposed. The n-th row (n is an integer of 1 to N) is connected to the horizontal signal line 219-$n$, and the m-th (m is an integer of 1 to M) column is connected to the vertical signal line 239-$m$.

Moreover, in the signal processing chip 202, a control section 240, M AD (Analog to Digital) converters 250, a data latch section 260, and a data processing section 270 are disposed. The AD converter 250 is disposed for each column. In the memory chip 203, a memory section 280 is disposed.

The control section 240 controls the row selecting section 210, the AD converters 250, and the data latch section 260 in synchronization with the vertical synchronization signal VSYNC.

The row selecting section 210 selects all the rows simultaneously and makes them to be exposed in accordance with the control of the control section 240. Moreover, the row selecting section 210 selects sequentially the rows for which exposure has been ended, and, makes them output analog pixel signals to the AD converters 250.

The AD converter 250 performs A/D conversion so as to convert a pixel signal from a corresponding column into a digital signal. This AD converter 250 supplies a signal having been subjected to the A/D conversion as pixel data to the data latch section 260.

The data latch section 260 reads out sequentially pixel data form the AD converter 250 in accordance with the control of the control section 240. This data latch section 260 supplies pixel data to the memory section 280 or the data processing section 270.

The memory section 280 holds image data including pixel data. The data processing section 270 performs CDS (Correlated Double Sampling) processing for image data. This data processing section 270 supplies the image data after the CDS processing to the image processing section 120.

In this connection, although the respective circuits and elements in the imaging element 200 are dispersively disposed in the three stacked chips, the number of chips in which they are disposed may be other than three (for example, two). In the case of disposing in two chips, for example, the memory section 280 is disposed on the signal processing chip 202 side. Moreover, the respective circuits and elements in the imaging element 200 may be disposed in a single chip.

[Constitution Example of Pixel Circuit]

Figure 4:
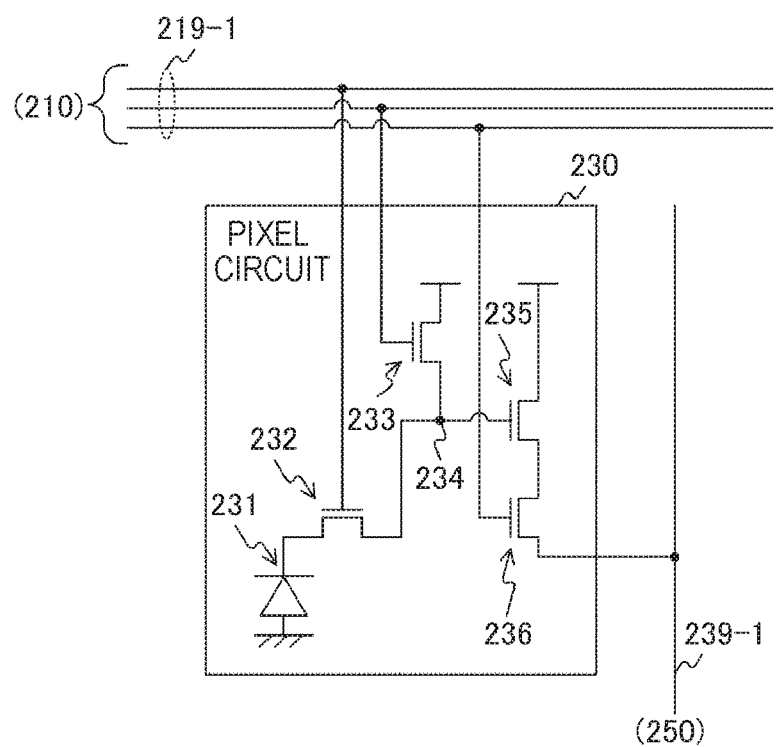
FIG. 4 is a circuit diagram showing one constitution example of a pixel circuit in the first embodiment of the present technology.

FIG. 4 is a circuit diagram showing one constitution example of the pixel circuit 230 in the first embodiment. This pixel circuit 230 includes a photodiode 231, a transfer transistor 232, a reset transistor 233, a floating diffusion layer 234, an amplification transistor 235, and a selection transistor 236.

The photodiode 231 performs photoelectric conversion of light and generates electric charges. It should be noted that the photodiode 231 is one example of a photoelectric conversion section described in claims.

The transfer transistor 232 transfers the electric charges generated by the photodiode 231 to the floating diffusion layer 234 in accordance with the control of the row selecting section 210.

The floating diffusion layer 234 accumulates the electric charges transferred from the photodiode 231, and generates a voltage corresponding to the amount of electric charges. The reset transistor 233 makes the amount of electric charges of the floating diffusion layer 234 an initial value in accordance with the control of the row selecting section 210.

The amplification transistor 235 amplifies the voltage of the floating diffusion layer 234. The selection transistor 236 supplies a signal of the voltage amplified by the amplification transistor 235 as a pixel signal to the AD converter 250 through a vertical signal line in accordance with the control of the row selecting section 210.

Figure 5:
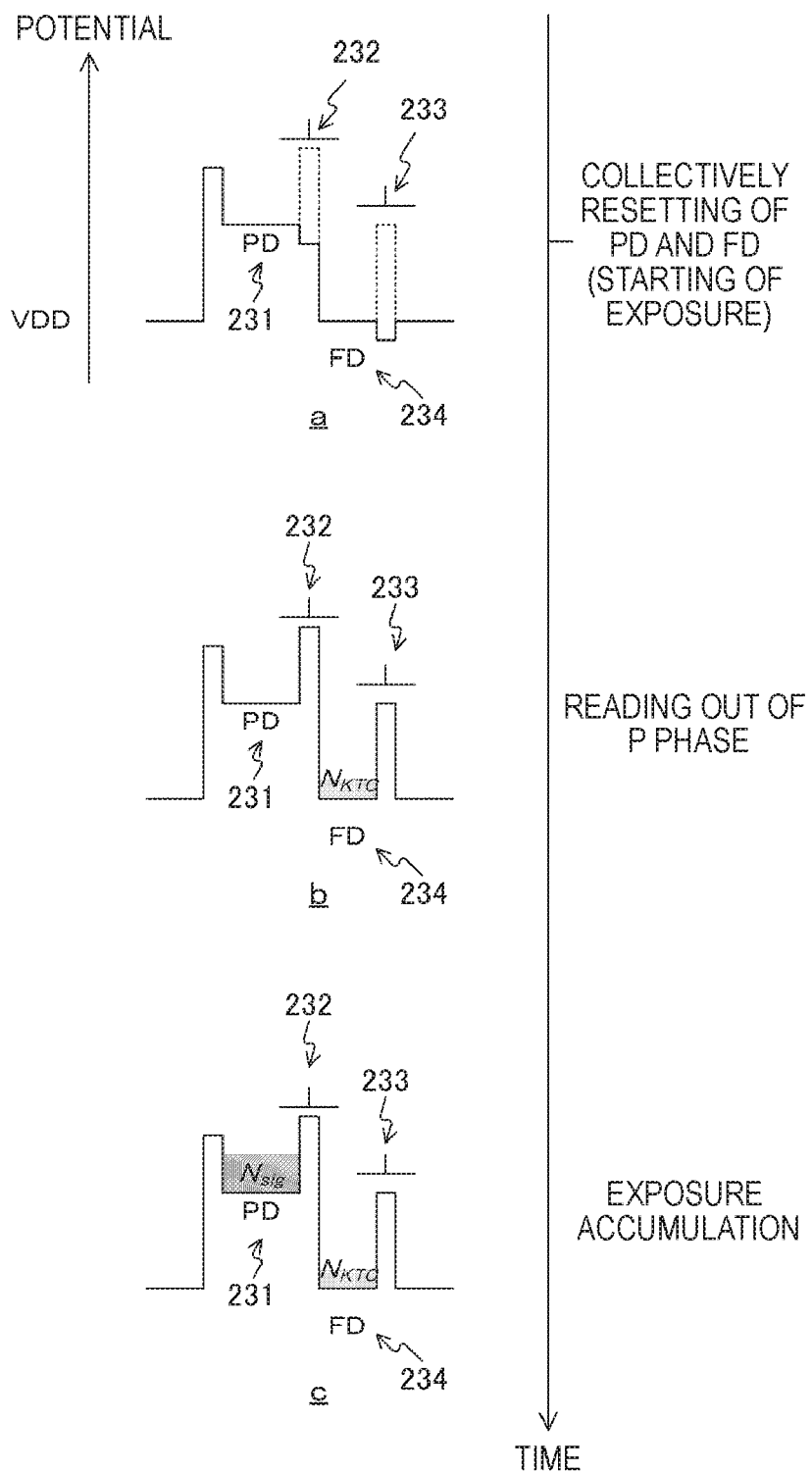
FIG. 5 is one example of a potential diagram of a pixel circuit at the time of starting exposure and during exposure in the first embodiment of the present technology.

FIG. 5 shows one example of a potential diagram of the pixel circuit 230 at the time of starting exposure and during exposure in the first embodiment. At the time of starting exposure, the row selecting section 210 selects all the rows simultaneously, and, controls the transfer transistors 232 of them to be in an ON state over a predetermined pulse period. With this, the photodiodes 231 and the floating diffusion layers 234 on all the rows are collectively reset. A portion "a" in the same figure shows a potential diagram at the time of starting exposure.

Next, the row selecting section 210 selects the rows sequentially, and, controls sequentially the reset transistors 233 and the selection transistors 236 to be in an ON state over a pulse period. With this, noise components $N_{KTC}$ caused by the resetting is read out as a P phase. A portion "b" in FIG. 5 shows a potential diagram at the time of reading out the P phase. The read-out P phase is held in the memory section 280.

Moreover, a signal component $N_{sig}$ corresponding to an exposure time is accumulated in the photodiode 231. A portion "c" in FIG. 5 shows a potential diagram at the time of exposure accumulation.

Figure 6:
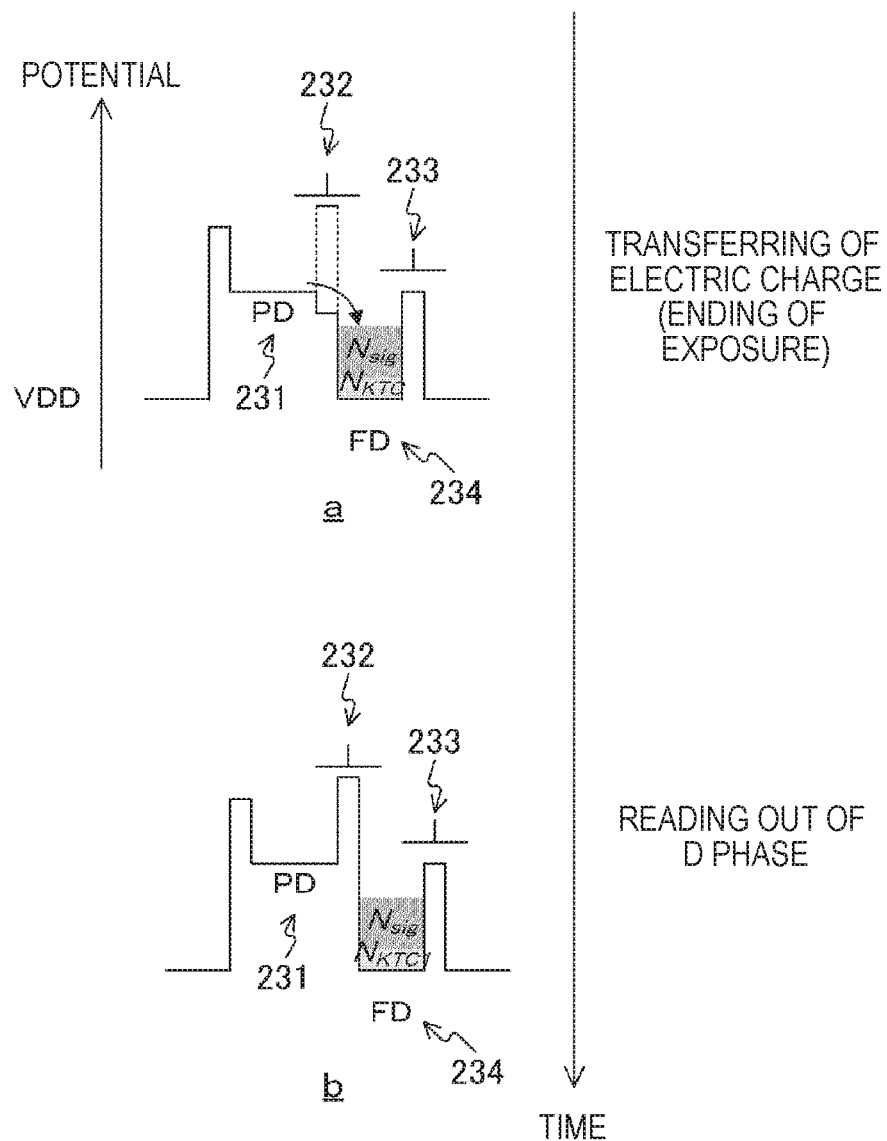
FIG. 6 is one example of a potential diagram of a pixel circuit at the time of ending exposure and during reading out in the first embodiment of the present technology.

FIG. 6 shows one example of a potential diagram of the pixel circuit 230 at the time of ending exposure and during reading out in the first embodiment. At the time of ending exposure, the row selecting section 210 selects all the rows, and, controls the transfer transistors 232 of them to be in an ON state over a pulse period. With this, the signal component $N_{sig}$ is transferred to the floating diffusion layer 234. A portion "a" in the same figure shows a potential diagram at the time of ending exposure.

When the exposure for all the rows has been ended, the row selecting section 210 selects sequentially the rows, and, controls the selection transistors 236 to be in an ON state over a pulse period. With this, a signal including the noise components $N_{KTC}$ and the signal component $N_{sig}$ is read out as a D phase. A portion "b" in FIG. 6 shows a potential diagram at the time of reading out the D phase.

The data processing section 270 reads out the P phase from the memory section 280, and, calculates a difference between the D phase and the P phase for each pixel. With this calculation, the noise component $N_{KTC}$ can be removed. This processing is called CDS processing.

Figure 7:
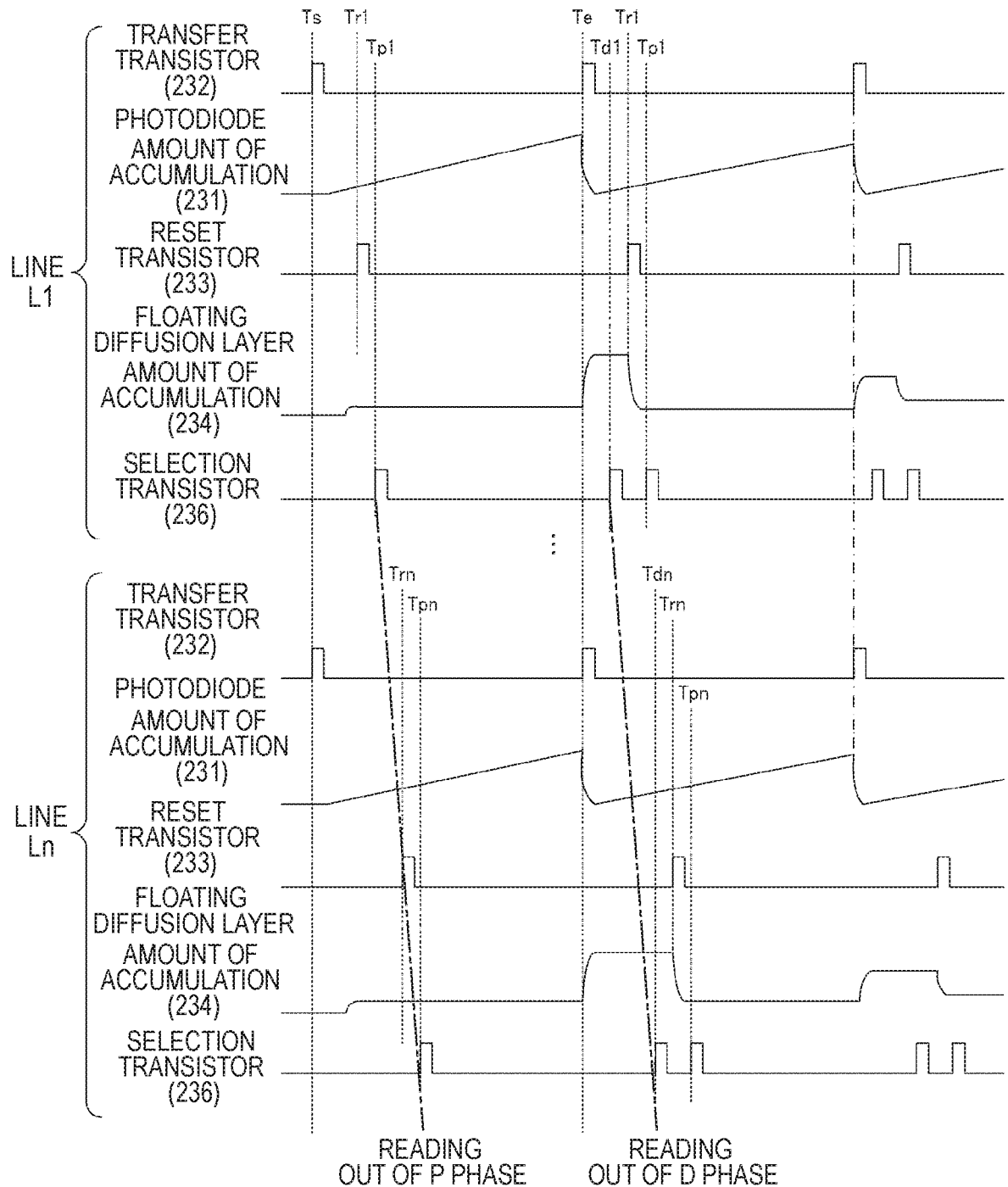
FIG. 7 is a timing chart showing one example of a control method of a pixel circuit in the first embodiment of the present technology.

FIG. 7 is a timing chart showing one example of a control method of the pixel circuit 230 in the first embodiment. At the time Ts of starting exposure for an image of the first sheet, the row selecting section 210 controls the transfer transistors 232 of all the lines (rows) to be in an ON state over a pulse period. At Tr1 after the starting of exposure, the row selecting section 210 controls the reset transistors 233 of the line L1 to be in an ON state over a pulse period. Moreover, at Tp1 after Tr1, the row selecting section 210 controls the selection transistors 236 of the line L1 to be in an ON state over a pulse period. With this, the P phase of the line L1 is read out. Next to the reading-out of the P phase of the line L1, the P phase of the line L2 is read out. In this way, the P phase of each line is read out sequentially.

Subsequently, at the time Te of ending exposure after the reading-out of the P phase of all the lines, the transfer transistors 232 of all the lines are controlled to be in an ON state over a pulse period. With this, the exposure for the image of the first sheet has been ended, and, in addition, the exposure for the image of the second sheet is started. At Td1 after the ending of the exposure for the first sheet, the row selecting section 210 controls the selection transistors 236 of the line L1 to be in an ON state over a pulse period. With this, the D phase of the line L1 is read out.

Moreover, at Tr1 after Td1, the row selecting section 210 controls the reset transistors 233 of the line L1 to be in an ON state over a pulse period. Moreover, at Tp1 after Tr1, the row selecting section 210 controls the selection transistors 236 of the line L1 to be in an ON state over a pulse period. With this, the P phase of the line L1 is read out. Next to the reading-out of the D phase and the P phase of the line L1, the D phase and the P phase of the line L2 are read out. In this way, the D phase and the P phase of each line are read out sequentially.

Figure 8:
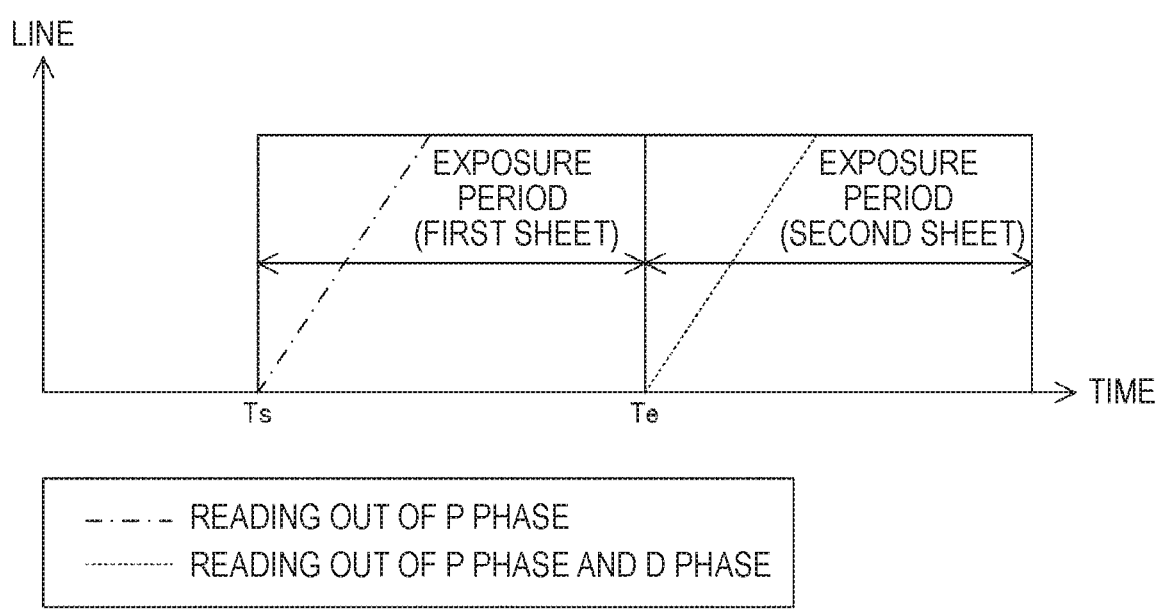
FIG. 8 is a timing chart showing one example of a timing of each of the starting of exposure, the ending of exposure, and reading-out in the first embodiment of the present technology.

FIG. 8 is a timing chart showing one example of a timing of each of the starting of exposure, the ending of exposure, and the reading-out in the first embodiment. In the same figure, the axis of ordinate shows the address of a line, and the axis of abscissa shows time. At the time Ts of starting exposure for the first sheet, the row selecting section 210 selects all the lines simultaneously, and, makes the exposure to be started. Then, the row selecting section 210 selects sequentially the lines, and, makes the selected line output the P phase.

At the time Te of ending the exposure for the first sheet, the row selecting section 210 selects all the lines simultaneously, and, makes the exposure to be ended. Moreover, simultaneously, the exposure for the second sheet is started. Then, the row selecting section 210 selects sequentially the lines, and, makes the selected line output the P phase and the D phase.

In this way, at the time of starting exposure and at the time of ending exposure, the row selecting section 210 selects all the lines (rows) simultaneously, and, at the time of reading out the pixel signal of the P phase or the D phase, it selects the lines sequentially. Generally, this control system is called the global shutter system. In the first embodiment, in any of the sensing mode and the viewing mode, an image is imaged with the global shutter system.

Figure 9:
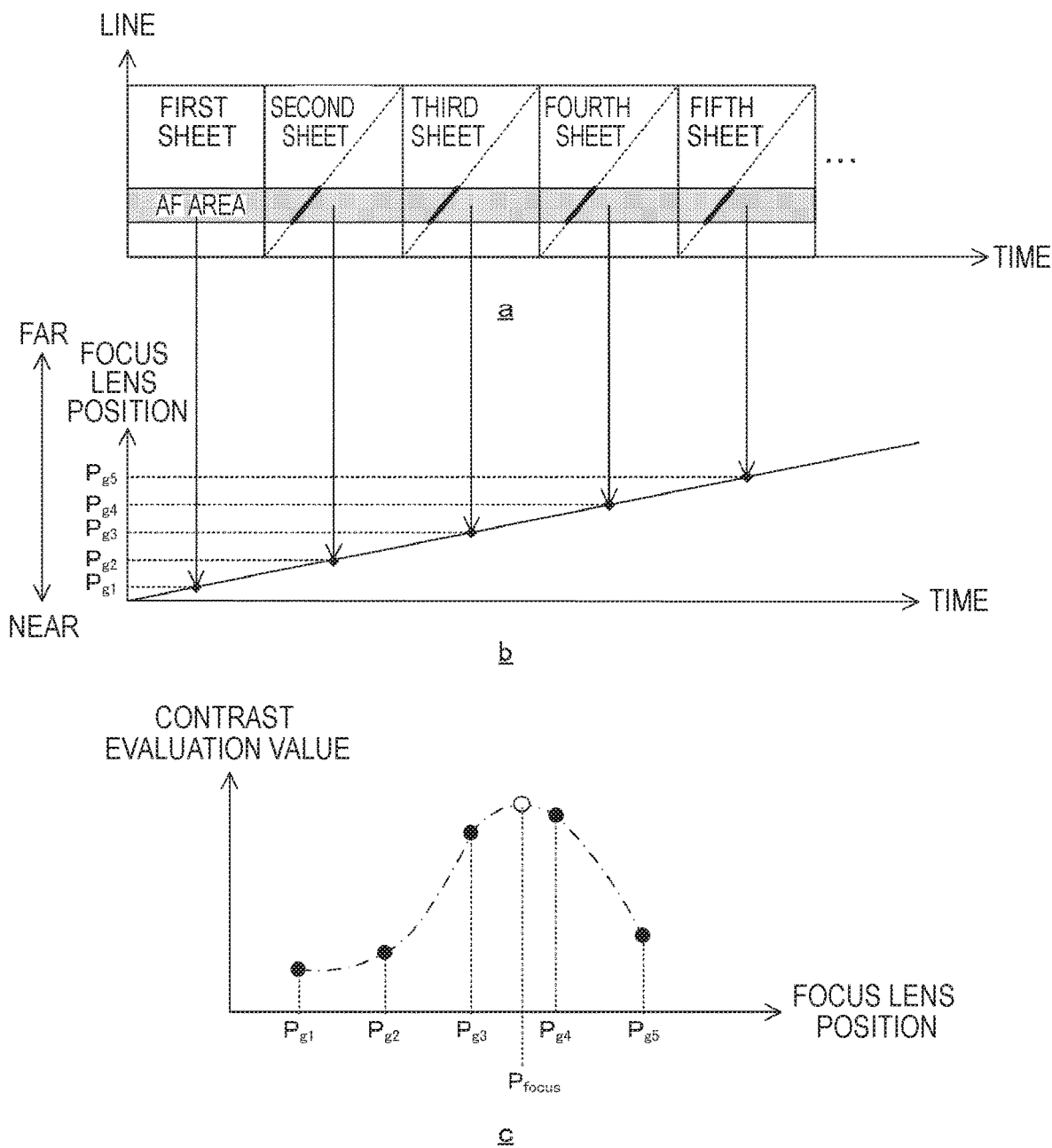
FIG. 9 is a diagram for describing the contrast AF system in the first embodiment of the present technology.

FIG. 9 is a diagram for describing the contrast AF system in the first embodiment. A portion "a" in the same figure is a timing chart showing one example of a timing of each of the starting of exposure, the ending of exposure, and the reading-out. In the portion "a" in the same figure, the axis of ordinate shows the address of a line, and the axis of abscissa shows time. Moreover, a gray area shows an AF area, and a solid line shows a read-out timing of a signal in the AF area. As exemplified in the portion "a" in the same figure, images of a plurality of sheets are continuously imaged with the global shutter system.

A portion "b" in FIG. 9 is a diagram showing one example of the locus of a focus lens. In the portion "b" in the same figure, the axis of ordinate shows the position of the focus lens, and the axis of abscissa shows time. As exemplified in the portion "b" in the same figure, the focus lens is driven from "Near" to "Far" at a fixed speed. Then, a plurality of images is imaged within the driving period. Among these, it is assumed that the positions of the focusing lens at the time of imaging from the first sheet to the fifth sheet are set to $P_{g1}$ to $P_{g5}$.

A portion "c" in FIG. 9 is a diagram showing one example of a contrast evaluation value curve. In the portion "c" in the same figure, the axis of ordinate shows a contrast evaluation value, and the axis of abscissa shows the position of the focusing lens. Moreover, the black circles in the portion c in the same figure are those where the respective contrast evaluation values corresponding to the focusing lens positions $P_{g1}$ to $P_{g5}$ are plotted. The focus detecting section 124 detects from the locus of those plots an in-focus position $P_{focus}$ where the contrast is the strongest.

Figure 10:
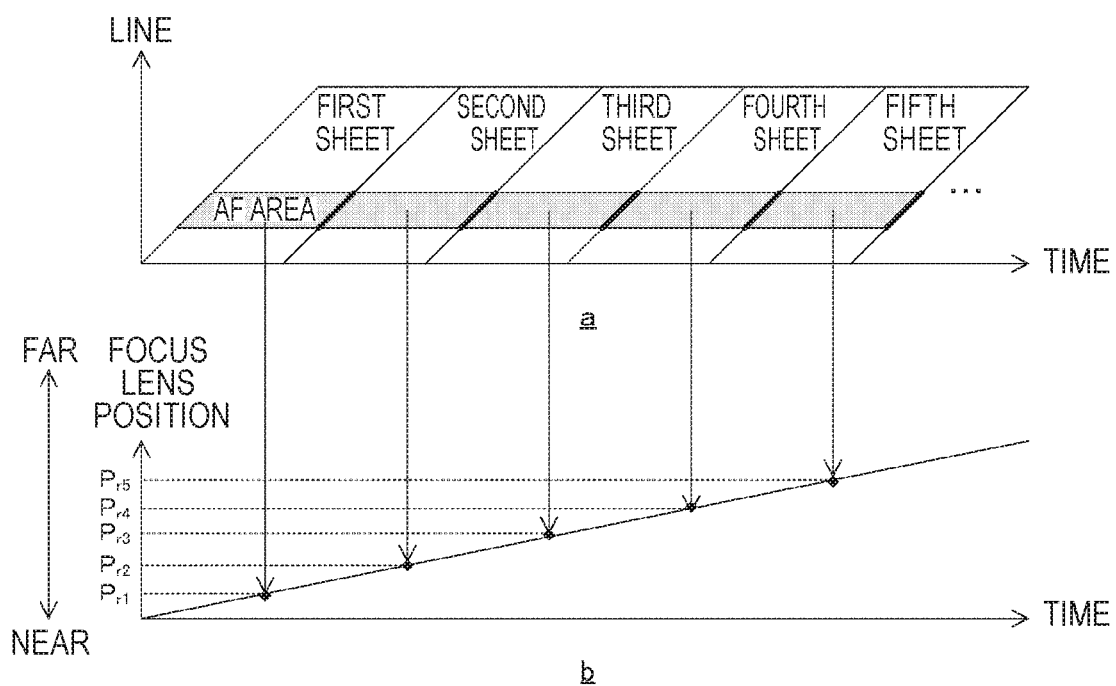
FIG. 10 is a diagram for describing the contrast AF system in a comparative example.

FIG. 10 is a diagram for describing the contrast AF system in a comparative example. In this comparative example, it is assumed that images are imaged with the rolling shutter system. A portion "a" in the same figure is a timing chart showing one example of a timing of each of the starting of exposure, the ending of exposure, and the reading-out. In the portion "a" in the same figure, the axis of ordinate shows the address of a line, and the axis of abscissa shows time. Moreover, a gray area shows an AF area, and a thick solid line shows a read-out timing of a signal in the AF area. As exemplified in the portion "a" in the same figure, with the rolling shutter system in which lines are selected sequentially in each of the starting of exposure, the ending of exposure, and the reading-out, a plurality of images is continuously imaged.

A portion "b" in FIG. 10 is a diagram showing one example of the locus of a focus lens. The locus of the focus lens in the comparative example is similar to that in the first embodiment. In this connection, the detection method of the focal position in the comparative example is similar to that in the first embodiment.

In this way, in the comparative example, during the driving of the focus lens, the images of a plurality of sheets are imaged with the rolling shutter system, and an in-focus position is detected from the contrast of those images.

FIG. 11 is a diagram for describing the AF accuracy in a comparative example. A portion "a" in the same figure shows a test image 500. In this test image 500, the contrast of the bottom line is the strongest, and the contrast of the top line is the weakest. Then, as becoming from the top line closer to the bottom line, the contrast becomes stronger gradually.

A portion "b" in FIG. 11 is a timing chart showing one example of a timing of each of the starting of exposure, the ending of exposure, and the reading-out. In the portion "a" in the same figure, the axis of ordinate shows the address of a line, and the axis of abscissa shows time. A solid line shows a timing at the time of imaging with the rolling shutter system, and a one-dot chain line shows a timing at the time of imaging with the global shutter system.

A portion "c" in FIG. 11 is a diagram showing one example of the locus of a focus lens. In the portion "b" in the same figure, the axis of ordinate shows the position of the focus lens, and the axis of abscissa shows time. A solid line shows a locus in the first embodiment and the comparative example in which a focus lens is driven also during a period of exposure. On the other hand, one-dot chain line shows a locus in the case of stopping a focus lens during exposure.

A constitution where a focus lens is stopped during exposure as exemplified with one-dot chain line in the portion "c" in FIG. 11 and imaging is performed with the global shutter system as exemplified with one-dot chain line in the portion "b" in the same figure, is assumed as a standard constitution. In this constitution, since the position of the focus lens for each line is the same, an in-focus position can be detected accurately. On the other hand, since the focus lens cannot be driven during exposure, a time until an in-focus position is detected, becomes long.

Next, consideration is given to the comparative example where the focus lens is driven during exposure as exemplified with the solid line in the portion "c" in FIG. 11 and imaging is performed with the rolling shutter system as exemplified with the solid line in the portion "b" in the same figure. In this comparative example, the position of the focusing lens for each line is different. For example, the position $P_{top}$ of the focus lens corresponding to the top line is closer to "Near" than the position $P_{bottom}$ of the focus lens corresponding to the bottom line.

Here, it is assumed that the actual in-focus position $P_{focus}$ of the focus lens is located on the "Far" side than the position $P_{bottom}$ corresponding to the bottom line. In this case, since the position $P_{bottom}$ corresponding to the bottom line is closer to the in-focus position $P_{focus}$ than the position $P_{center}$ corresponding to the central line, the contrast of the bottom line becomes stronger than the standard constitution. On the other hand, at the top line of the test image 500, since the original contrast is weak, as compared with the standard constitution, there are few fluctuations. In this way, as closer to the top line, the contrast becomes stronger than the standard, and the contrast of the whole image becomes stronger than the standard.

On the other hand, in the first embodiment, since the imaging is performed with the global shutter system, the position of the focus lens for each line becomes the same. Therefore, the contrast acquired in the first embodiment becomes almost the standard value. Strictly, since the position of the focus lens is different between at the time of starting exposure and at the time of ending exposure, an error arises a little relative to the standard constitution where those positions are the same. However, such an error becomes smaller than the case where the imaging is performed with the rolling shutter system.

In this way, as compared with the comparative example of the rolling shutter system, the AF accuracy can be improved by imaging with the global shutter system. Moreover, as compared with the standard constitution where the focus lens is stopped during exposure, the AF speed can be made quick by driving the focus lens during exposure. Here, the AF speed indicate a time after starting detection of an in-focus position until the detection is ended. Therefore, the imaging apparatus 100 can detect a focus at high speed and with high accuracy in the contrast AF system.

[Operation Example of Imaging Apparatus]

Figure 12:
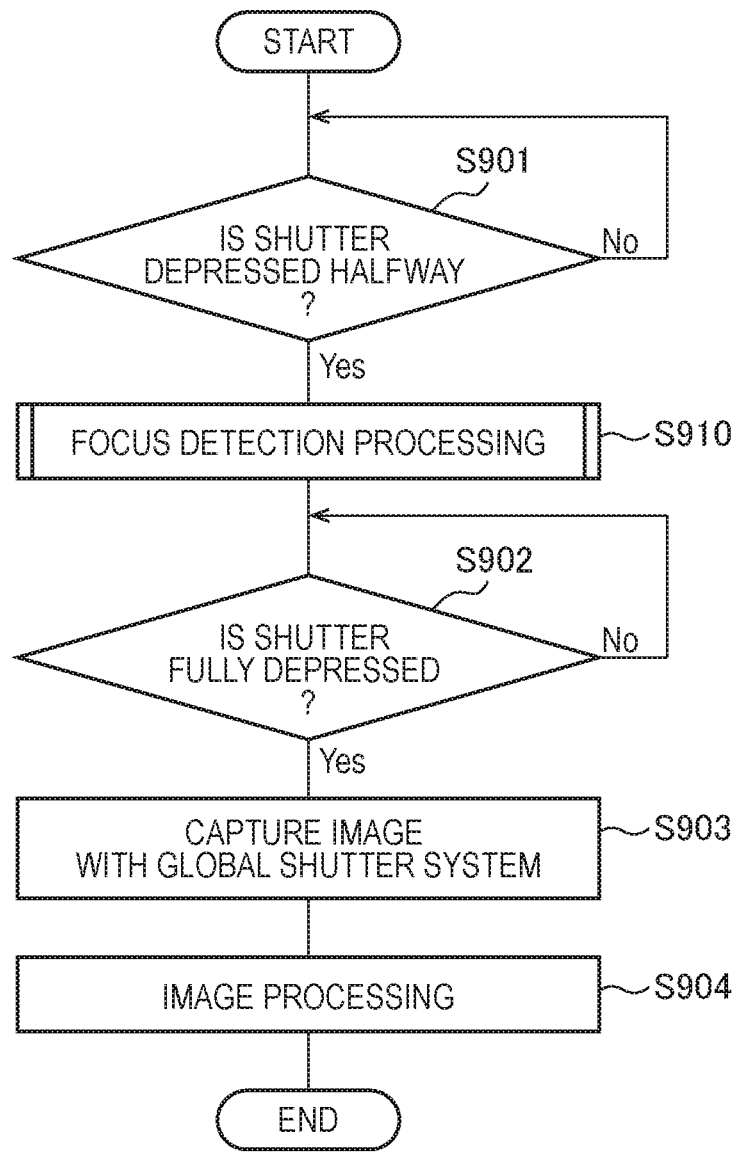
FIG. 12 is a flowchart showing one example of operation of an imaging apparatus in the first embodiment of the present technology.

FIG. 12 is a flowchart showing one example of operation of the imaging apparatus 100 in the first embodiment. This operation is started, for example, when a power source is given to the imaging apparatus 100. The imaging apparatus 100 determines whether a shutter button has been depressed halfway (Step S901). In the case where the shutter button is not depressed halfway (Step S901: No), the imaging apparatus 100 repeats Step S901.

In the case where the shutter button has been depressed halfway (Step S901: Yes), the imaging apparatus 100 executes focus detection processing for detecting an in-focus position (Step S910). Successively, the imaging apparatus 100 determines whether the shutter button has been fully depressed (Step S902). In the case where the shutter button is not fully depressed, (Step S902: No), the imaging apparatus 100 repeats Step S902.

In the case where the shutter button has been fully depressed (Step S902: Yes), the imaging apparatus 100 captures image data with the global shutter system (Step S903). The imaging apparatus 100 performs various kinds of image processing for the image data (Step S904), and, ends the operation for the imaging.

Figure 13:
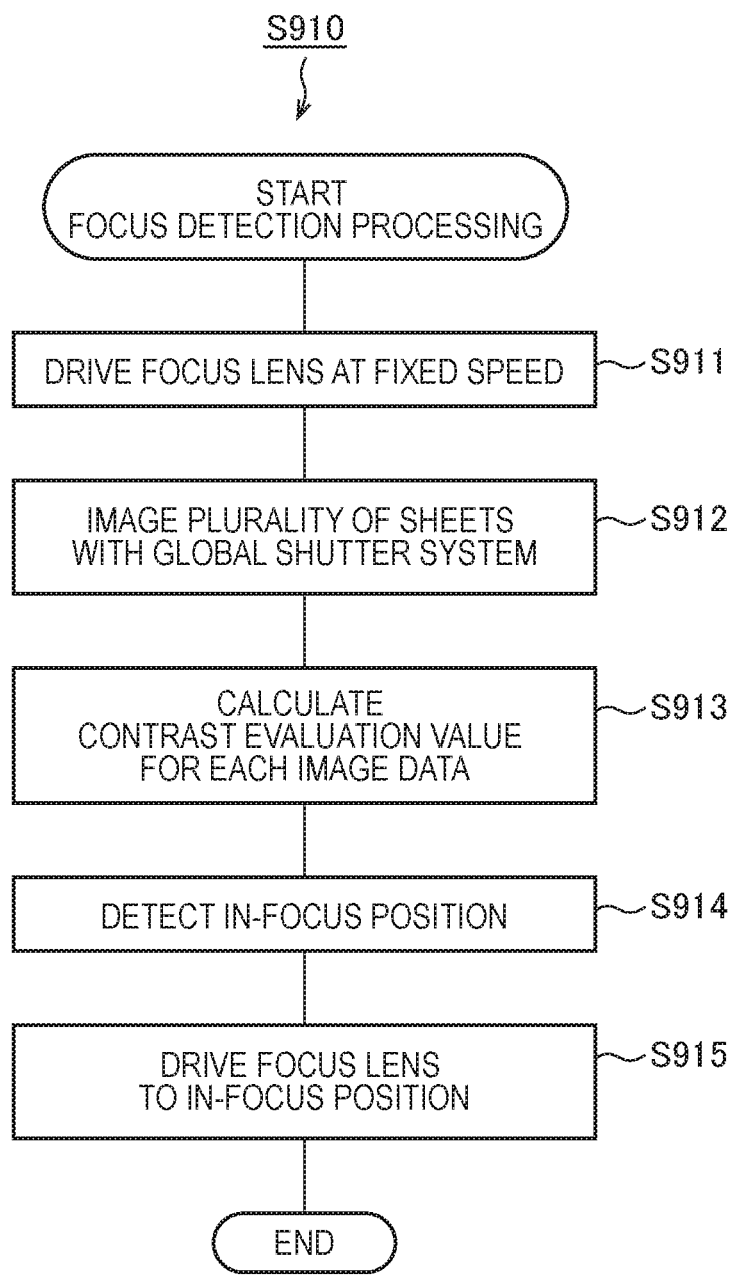
FIG. 13 is a flowchart showing one example of focus detection processing in the first embodiment of the present technology.

FIG. 13 is a flowchart showing one example of the focus detection processing in the first embodiment. The imaging apparatus 100 drives the focus lens from "Near" to "Far" at a fixed speed (Step S911). Moreover, the imaging apparatus 100 images the image data of a plurality of sheets with the global shutter system during the driving of the focus lens (Step S912). Then, the imaging apparatus 100 calculates the contrast evaluation value of the AF area for each of the image data (Step S913).

The imaging apparatus 100 detects an in-focus position from the calculated contrast evaluation values and the corresponding positions of the focus lens (Step S914). Then, the imaging apparatus 100 drives the focus lens to the detected in-focus position (Step S915), and, ends the focus detection processing.

In this way, according to the first embodiment of the present technology, while driving the focus lens over a driving period, the imaging apparatus 100 starts and ends exposure for all the rows simultaneously. Accordingly, all the positions of the focus lens corresponding to the respective rows can be made the same. With this, as compared with the case where the starting of exposure and the ending of exposure are performed for each row sequentially, the AF accuracy can be improved. Moreover, as compared with the constitution where exposure is performed during the stopping of the focus lens, the AF speed can be improved.

2. Second Embodiment

In the above-mentioned first embodiment, in the sensing mode where a focus is detected and in the viewing mode where imaging is performed in a state of being in-focus, image data with the same resolution has been imaged. However, as the resolution of image data becomes higher, the read-out takes longer time, which leads to a fear that the AF speed may lower in the sensing mode. In a point that the AF speed has been improved, the imaging apparatus 100 of the second embodiment is different from the first embodiment.

Figure 14:
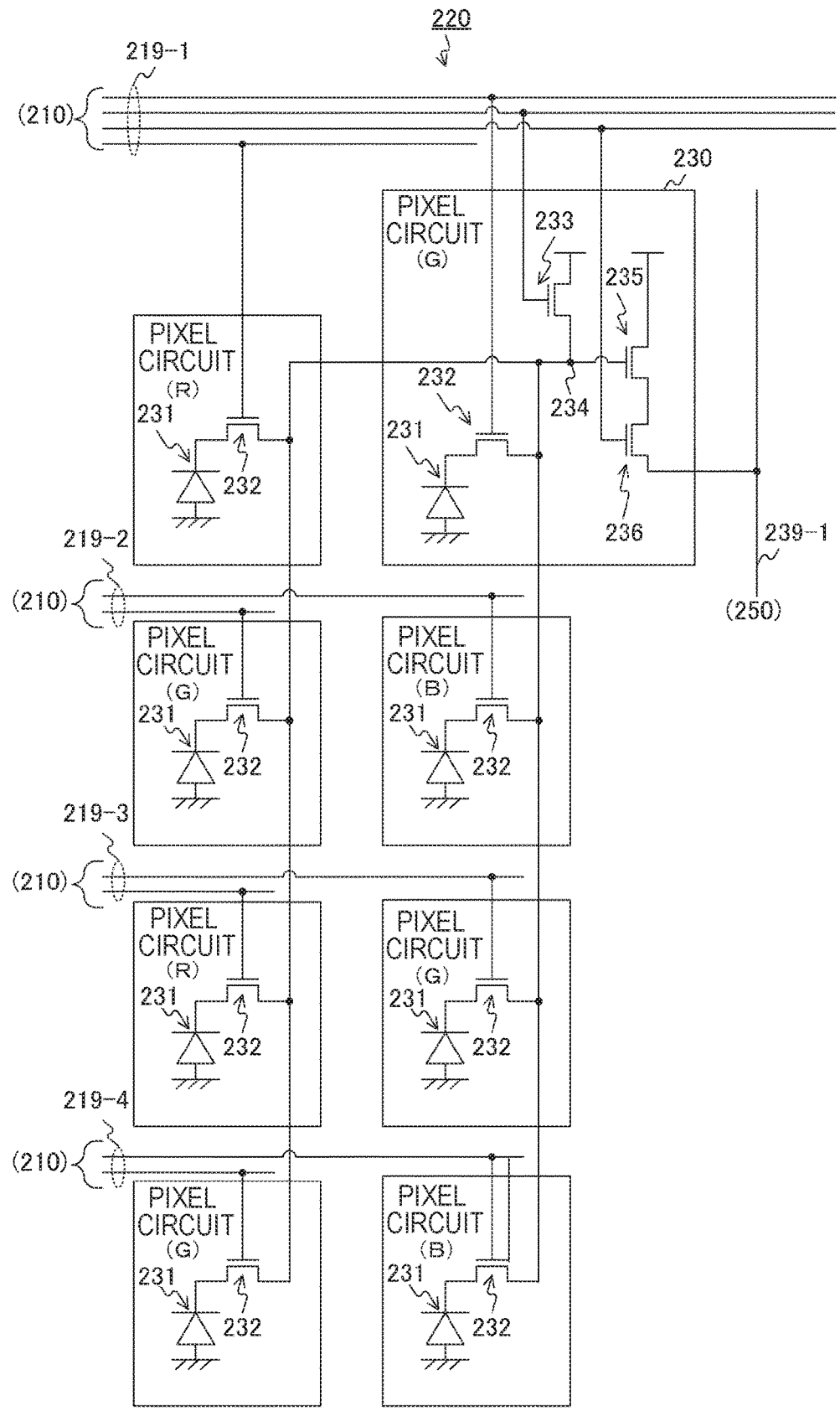
FIG. 14 is a circuit diagram showing one constitution example of a pixel array section in the second embodiment of the present technology.

FIG. 14 is a circuit diagram showing one constitution example of the pixel array section 220 in the second embodiment. In the pixel array section 220 of the second embodiment, a pixel block including eight pixel circuits 230 of four rows×two columns is disposed in a two-dimensional lattice form. In this pixel block, in only any one of the pixel circuits 230, the reset transistor 233, the floating diffusion layer 234, the amplification transistor 235, and the selection transistor 236 are disposed. Moreover, in all the pixel circuits 230, the photodiode 231 and the transfer transistor 232 are disposed. The transfer transistor 232 of each of the eight pixel circuits 230 is connected in common to the one floating diffusion layer 234. That is, the one floating diffusion layer 234 is shared by the eight pixel circuits 230. In this connection, it may be constituted that the reset transistor 233, the floating diffusion layer 234, the amplification transistor 235, and the selection transistor 236 are disposed on the outside of the pixel circuit and these are shared by each of the pixel circuits.

In the sensing mode, at the time of staring exposure and at the time of ending exposure, the row selecting section 210 in the second embodiment selects all the lines Lb including the pixel blocks simultaneously. With this, all the electric charges in the pixel block are transferred to the shared floating diffusion layer 234, and analog addition is performed on the pixel signals of the eight pixels. Moreover, in the reading-out, the row selecting section 210 selects the lines Lb sequentially. Since the pixel block is four rows×two columns, the number of the lines Lb including the pixel blocks becomes one fourth (¼) of the lines Lp including the pixel circuits 230. Therefore, as compared with the first embodiment, the time necessary for reading out an image of one sheet becomes one fourth, and the AF speed can be improved. Instead, although the resolution lowers by the pixel addition, in the contrast AF system, there is little influence that the lowering of the resolution gives to the AF accuracy.

On the other hand, in the viewing mode, the row selecting section 210 selects the lines Lp including the pixel circuits 230 sequentially, and, makes them to be exposed. In this viewing mode, since the pixel addition is not performed, the image data with higher resolution than the sensing mode can be acquired.

That is, in the sensing mode, the imaging apparatus 100 of the second embodiment images an image with low resolution with the global shutter system. On the other hand, in the viewing mode, the imaging apparatus 100 images an image with high resolution with the rolling shutter system.

In this connection, although the imaging apparatus 100 performs the pixel addition for all the pixels in the pixel block in the sensing mode, a constitution may be made such that some of the pixels (for example, four pixels aligned in the column direction) in the pixel block are added. With this, as compared the case of adding eight pixels, the resolution can be improved, and the AF accuracy can be raised.

Moreover, as long as a plurality of pixels aligned in the column direction is included, a pixel block may include pixels of a combination (two rows×one column etc.) other than four rows×two columns.

Figure 15:
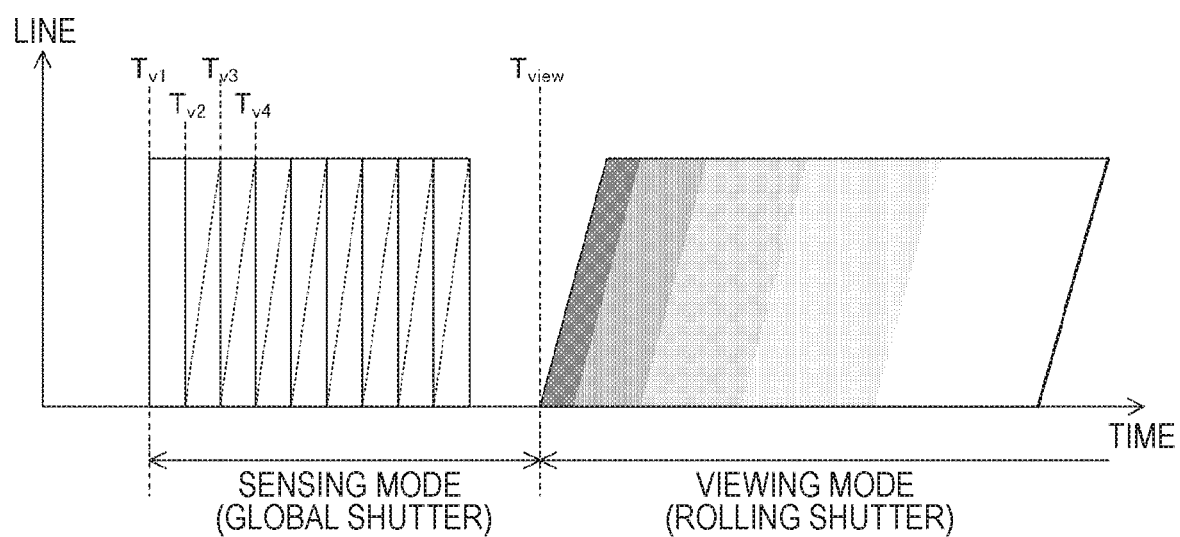
FIG. 15 is a timing chart showing one example of a timing of each of the starting of exposure, the ending of exposure, and the reading-out in the second embodiment of the present technology.

FIG. 15 is a timing chart showing one example of a timing of each of the starting of exposure, the ending of exposure, and the reading-out in the second embodiment. In the same figure, the axis of ordinate shows an address of each of lines, and the axis of abscissa shows time.

In the sensing mode, the imaging apparatus 100 images image data at timings $T_{v1}$, $T_{v2}$, $T_{v3}$, $T_{v4}$, etc. with the global shutter system, and, detects an in-focus position from the contrasts of those image data. Then, upon shifting to the viewing mode at a timing $T_{view}$, the imaging apparatus 100 images image data with the rolling shutter system.

Figure 16:
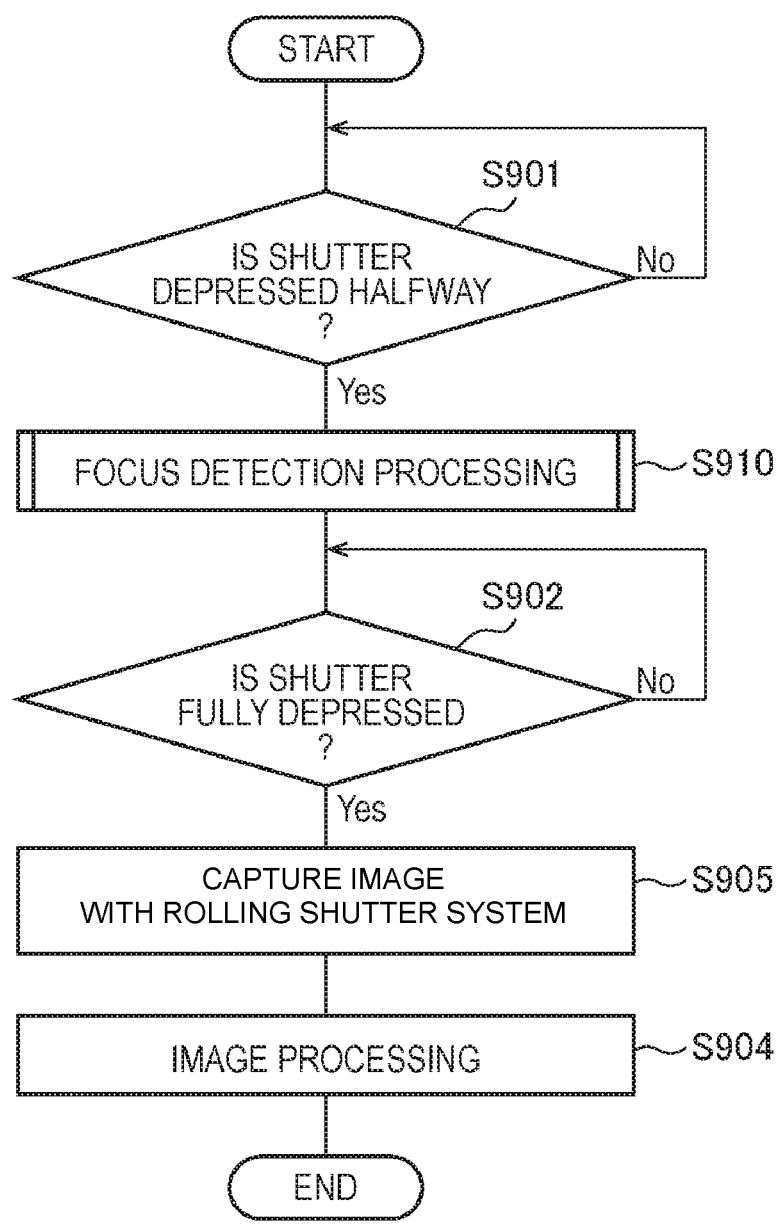
FIG. 16 is a flowchart showing one example of operation of an imaging apparatus in the second embodiment of the present technology.

FIG. 16 is a flowchart showing one example of operation of the imaging apparatus 100 in the second embodiment. In a point that Step S905 is executed instead of Step S903, the operation of the imaging apparatus 100 in the second embodiment is different from the first embodiment.

In the case where a shutter button is fully depressed (Step S902: Yes), the imaging apparatus 100 captures image data with the rolling shutter system (Step S905), and, executes Step S904.

In this way, according to the second embodiment of the present technology, the imaging apparatus 100 detects a focus from the contrast of an image with low resolution, and, images an image with high resolution after an in-focus. Accordingly, an image for the detection of a focus is imaged at high speed, whereby the AF speed can be improved.

3. Third Embodiment

In the above-mentioned first embodiment, although image data generated in the sensing mode is used only for the detection of a focus, this image data can also be used in the viewing mode. In a point that image data imaged by the viewing mode is processed by using image data generated by the sensing mode, the imaging apparatus 100 of the third embodiment is different from the first embodiment.

Figure 17:
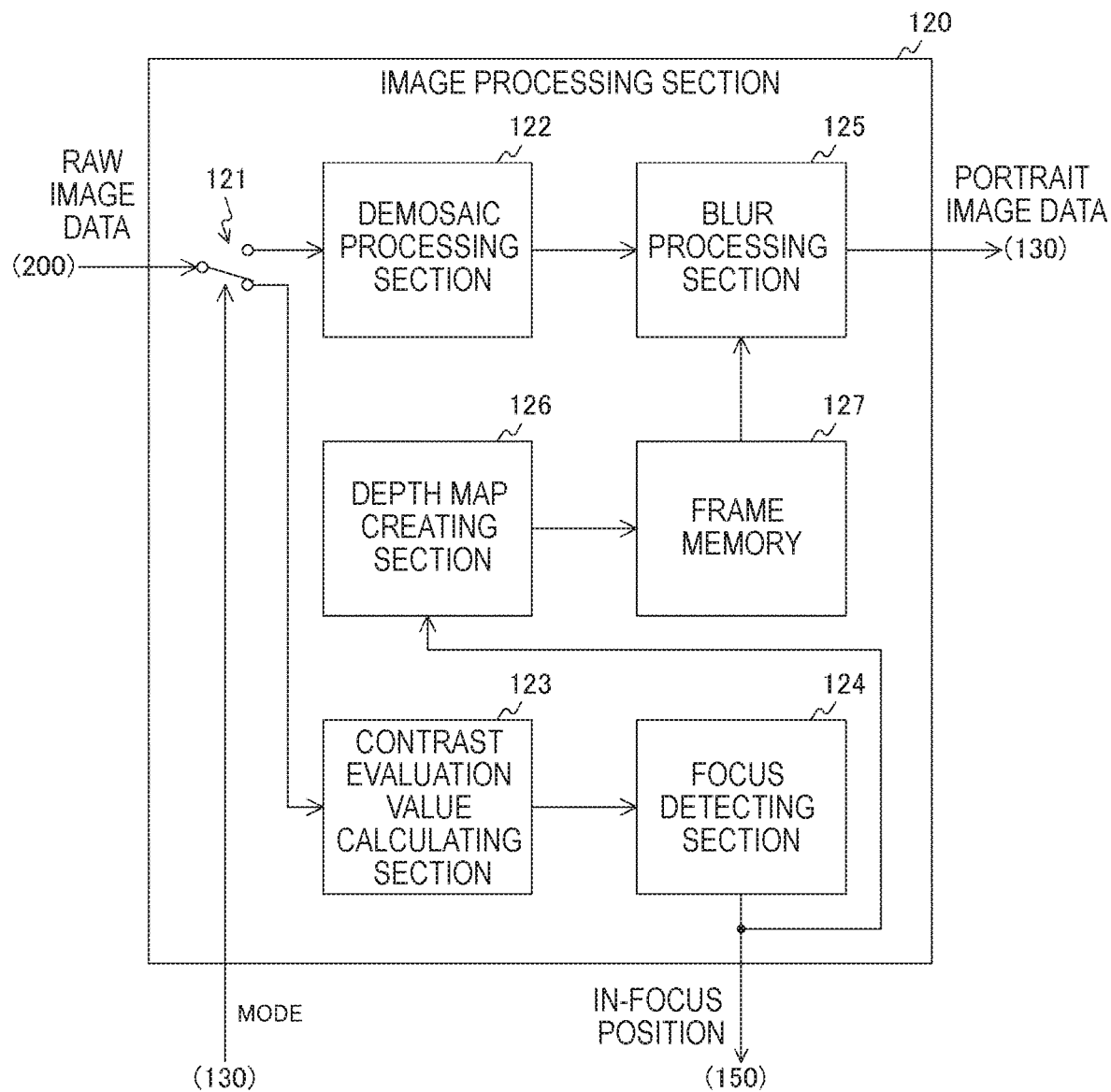
FIG. 17 is a block diagram showing one constitution example of an image processing section in the third embodiment of the present technology.

FIG. 17 is a block diagram showing one constitution example of the image processing section 120 in the third embodiment. In a point of further including a depth map creating section 126 and a frame memory 127, the image processing section 120 of the third embodiment is different from the first embodiment.

The depth map creating section 126 creates a depth map on the basis of an in-focus position detected by the focus detecting section 124. This depth map is image data which indicates a distance to a photographic subject for each pixel or each of a plurality of blocks that divides an image. For example, a gray image that indicates a distance with lightness is created as a depth map. The depth map creating section 126 makes the frame memory 127 hold the created depth map.

A blur processing section 125 performs blur processing for image data on the basis of the depth map. For example, the blur processing is performed for a portion located far away than a prescribed distance, thereby creating a portrait image in which a photographic subject located at a closer side is emphasized. By using the depth map, it becomes unnecessary for a user to designate manually a range to be made blur, thereby improving convenience. It should be noted that the blur processing section 125 is one example of a latter-stage processing section described in claims.

In this connection, as long as image data generated in the sensing mode is used, the image processing section 120 may perform image processing other than the blur processing. For example, the image processing section 120 may perform processing for creating a pair of parallax images from one image data on the basis of a depth map. Moreover, in the third embodiment, similarly to the second embodiment, when the sensing mode has been set, an image with low resolution may be imaged with the global shutter system, and when the viewing mode has been set, an image with high resolution may be imaged with the rolling shutter system.

In this way, according to the third embodiment of the present technology, since the blur processing etc. are performed by using the depth map created at the time of detecting a focus, it becomes unnecessary for a user to designate manually a range to be made blur, whereby the convenience can be improved.

The above-described embodiments are examples for embodying the present technology, and matters in the embodiments each have a corresponding relationship with disclosure-specific matters in the claims. Likewise, the matters in the embodiments and the disclosure-specific matters in the claims denoted by the same names have a corresponding relationship with each other. However, the present technology is not limited to the embodiments, and various modifications of the embodiments may be embodied in the scope of the present technology without departing from the spirit of the present technology.

The processing sequences that are described in the embodiments described above may be handled as a method having a series of sequences or may be handled as a program for causing a computer to execute the series of sequences and recording medium storing the program. As the recording medium, a CD (Compact Disc), an MD (MiniDisc), and a DVD (Digital Versatile Disc), a memory card, and a Blu-ray disc (registered trademark) can be used.

Note that the effects described in the present specification are not necessarily limited, and any effect described in the present disclosure may be exhibited.

Additionally, the present technology may also be configured as below.

(1)
An imaging apparatus, including:
a focus lens driving section that moves a position of a focus lens from one of an image side and an object side to the other over a predetermined driving period;
an imaging section that generates image data by starting exposure for a plurality of lines simultaneously and then by ending the exposure for the plurality of lines simultaneously within the predetermined driving period; and
a focus detecting section that detects an in-focus position of the focus lens on a basis of contrast of the image data.

(2)
The imaging apparatus according to (1), in which
the plurality of lines includes a plurality of pixel blocks arranged in a predetermined direction, and
each of the plurality of pixel blocks includes
a floating diffusion layer,
a plurality of photoelectric conversion sections, and
a plurality of transfer transistors that transfers respective electric charges generated by the plurality of photoelectric conversion sections, to the floating diffusion layer.

(3)
The imaging apparatus according to (2), in which the plurality of transfer transistors transfers the electric charges to the floating diffusion layer simultaneously at a starting time point and at an ending time point of a predetermined exposure period within the driving period.

(4)
The imaging apparatus according to (2), in which some transistors among the plurality of transfer transistors transfer the electric charges to the floating diffusion layer simultaneously at a starting time point and at an ending time point of a predetermined exposure period within the driving period.

(5)
The imaging apparatus according to any of (2) to (4), in which
the focus lens driving section moves the focus lens to the in-focus position, and
when the focus lens has moved to the in-focus position, the imaging section images high resolution image data with resolution higher than the image data, by starting exposure for lines more than the plurality of lines sequentially and then by ending exposure for the plurality of lines sequentially.

(6)
The imaging apparatus according to (1), in which
each of the plurality of lines includes a plurality of pixels arranged in a predetermined direction, and
each of the plurality of pixels includes
a floating diffusion layer,
a photoelectric conversion section, and
a transfer transistor that transfers an electric charge generated by the photoelectric conversion section to the floating diffusion layer.

(7)
The imaging apparatus according to any of (1) to (7), further including:
a depth map creating section that creates a depth map from the in-focus position; and
a latter-stage processing section that executes predetermined image processing for new image data different from the image data on a basis of the depth map,
in which the focus lens driving section moves the focus lens to the in-focus position, and
when the focus lens has moved to the in-focus position, the imaging section images the new image data.

(8)
The imaging apparatus according to any of (1) to (7), in which the imaging section includes
a pixel array section in which a plurality of lines is arranged,
a driver that causes an image signal to be generated by starting exposure for the plurality of lines simultaneously and then by ending exposure for the plurality of lines simultaneously within the predetermined driving period, and
a signal processing section that generates the image data by performing predetermined signal processing for the image signal.

(9)
The imaging apparatus according to (8), in which the signal processing includes correlated double sampling processing.

(10)

The imaging apparatus according to (8) or (9), in which the pixel array section is disposed in a predetermined chip among a plurality of stacked chips, and the signal processing section is disposed in a chip different from the predetermined chip among the plurality of chips.

(11)

The imaging apparatus according to any of (1) to (10), in which the imaging section includes a complementary metal oxide semiconductor (CMOS) image sensor.

(12)

An imaging apparatus, including:

an imaging section that performs processing that generates image data by starting exposure for a plurality of lines simultaneously and then by ending the exposure for the plurality of lines simultaneously, and processing that generates high resolution image data with resolution higher than the image data by starting exposure for a plurality of lines sequentially and then by ending the exposure for the plurality of lines sequentially; and an image processing section that performs processing that detects an in-focus position of the focus lens on a basis of contrast of the image data, and predetermined image processing for the high resolution image data.

(13)

A control method of an imaging apparatus, the control method including:

a focus lens driving procedure that moves a position of a focus lens from one of an image side and an object side to the other over a predetermined driving period;

an imaging procedure that generates image data by starting exposure for a plurality of lines simultaneously and then by ending the exposure for the plurality of lines simultaneously within the predetermined driving period; and a focus detecting procedure that detects an in-focus position of the focus lens on a basis of contrast of the image data.

REFERENCE SIGNS LIST 100 imaging apparatus
110 imaging lens
120 image processing section
121 switching section
122 demosaic processing section
123 contrast evaluation value calculating section
124 focus detecting section
125 blur processing section
126 depth map creating section
127 frame memory
130 recording section
140 imaging control section
150 focus lens driving section
200 imaging element
201 pixel array chip
202 signal processing chip
203 memory chip
210 row selecting section
220 pixel array section
230 pixel circuit
231 photodiode
232 transfer transistor
233 reset transistor
234 floating diffusion layer
235 amplification transistor
236 selection transistor
240 control section
250 AD converter
260 data latch section
270 data processing section
280 memory section

The invention claimed is:

1. An imaging apparatus comprising:
   an imaging section that comprises:
      an imaging element that is configured to convert, into sheets of image data, light from a photographic subject, and
      an imaging lens that is configured to focus the light onto the imaging element; and
   a focus lens driving section that is configured to:
      drive, while the imaging element converts the light into the sheets of image data, the imaging lens at a fixed speed, and
      drive, when the focus lens driving section receives an in-focus position of the imaging lens, the imaging lens to the in-focus position,
   wherein the imaging section, when the focus lens driving section has driven the imaging lens to the in-focus position, images high resolution image data with resolution higher than the image data.

2. The imaging apparatus according to claim 1, wherein the imaging section is configured to image the high resolution image data with the resolution higher than the image data by starting exposure for lines more than the lines before ending exposure for the lines.

3. The imaging apparatus according to claim 2, wherein the lines comprise pixel blocks arranged in a predetermined direction.

4. The imaging apparatus according to claim 1, wherein the imaging element configured to convert, using a global shutter system, the light into the sheets of image data.

5. The imaging apparatus according to claim 1, wherein the imaging apparatus is configured to calculate, from the sheets of the image data, a set of contrast evaluation values.

6. The imaging apparatus according to claim 5, wherein the imaging apparatus is configured to determine, from a highest one of the contrast evaluation values, the in-focus position.

7. The imaging apparatus according to claim 5, wherein one of the contrast evaluation values indicates a degree of an intensity of contrast within an AF area in one of the sheets.

8. The imaging apparatus according to claim 7, wherein the in-focus position is a position of the imaging lens at which the contrast of the image data becomes strongest.

9. The imaging apparatus according to claim 7, wherein another of the contrast evaluation values indicates a degree of an intensity of contrast within an AF area in another of the sheets.

10. A control method of an imaging apparatus, the method comprising:
   converting, by an imaging element in an imaging section, light from a photographic subject into sheets of image data;
   focusing, by an imaging lens in the imaging section, the light onto the imaging element;
   driving, by a focus lens driving section while the imaging element converts the light into the sheets of image data, the imaging lens at a fixed speed;
   driving, by the focus lens driving section when the focus lens driving section receives an in-focus position of the imaging lens, the imaging lens to the in-focus position; and
   imaging, by the imaging section when the focus lens driving section has driven the imaging lens to the in-focus position, high resolution image data with resolution higher than the image data.

11. The method according to claim 10, wherein the imaging section images the high resolution image data with the resolution higher than the image data by starting exposure for lines more than the lines before ending exposure for the lines.

12. The method according to claim 11, wherein the lines comprise pixel blocks arranged in a predetermined direction.

13. The method according to claim 10, wherein the imaging element converts, using a global shutter system, the light into the sheets of image data.

14. The method according to claim 10, further comprising:
    calculating, by the imaging section from the sheets of the image data, a set of contrast evaluation values.

15. The method according to claim 14, further comprising:
    determining, by the imaging apparatus from a highest one of the contrast evaluation values, the in-focus position.

16. The method according to claim 14, wherein one of the contrast evaluation values indicates a degree of an intensity of contrast within an AF area in one of the sheets.

17. The method according to claim 16, wherein the in-focus position is a position of the imaging lens at which the contrast of the image data becomes strongest.

18. The method according to claim 16, wherein another of the contrast evaluation values indicates a degree of an intensity of contrast within an AF area in another of the sheets.

* * * * *